US012500067B2

(12) United States Patent
Lane et al.

(10) Patent No.: US 12,500,067 B2
(45) Date of Patent: Dec. 16, 2025

(54) APPARATUS FOR EDGE CONTROL DURING PLASMA PROCESSING

(71) Applicant: Tokyo Electron Limited, Tokyo (JP)

(72) Inventors: Barton Lane, Austin, TX (US); Alok Ranjan, Austin, TX (US); Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 252 days.

(21) Appl. No.: 17/661,848

(22) Filed: May 3, 2022

(65) Prior Publication Data

US 2023/0360889 A1 Nov. 9, 2023

(51) Int. Cl.
*H01J 37/32* (2006.01)

(52) U.S. Cl.
CPC .. *H01J 37/32385* (2013.01); *H01J 37/32036* (2013.01); *H01J 37/32642* (2013.01)

(58) Field of Classification Search
CPC ........... H01J 37/32036; H01J 37/32385; H01J 37/32642; H01J 37/32715
See application file for complete search history.

(56) References Cited

U.S. PATENT DOCUMENTS 5,529,657 A * 6/1996 Ishii .................. H01J 37/32642 156/915
5,942,039 A * 8/1999 Kholodenko ..... H01J 37/32642 118/723 MP
6,232,236 B1 * 5/2001 Shan ................. H01J 37/32165 438/726
2004/0023513 A1 2/2004 Aoyama et al.
2005/0116788 A1 6/2005 Matters-Kammerer et al.
2006/0151116 A1 7/2006 Wu
(Continued)

FOREIGN PATENT DOCUMENTS

| | | | |
|---|---|---|---|
| EP | 1459444 | A1 | 9/2004 |
| JP | 2015018796 | A | 1/2015 |
| KR | 20190056021 | A | 5/2019 |

OTHER PUBLICATIONS

International Searching Authority, "Notification of Transmittal of The International Search Report and The Written Opinion of The International Searching Authority,or The Declaration," International application No. PCT/US2023/020619, Aug. 23, 2023, 11 pages.
(Continued)

*Primary Examiner* — Benjamin Kendall
(74) *Attorney, Agent, or Firm* — Slater Matsil, LLP

(57) ABSTRACT

An apparatus for plasma processing includes a pedestal configured to support a substrate and a conductive structure disposed at the pedestal. The conductive structure is configured to generate a plasma localized at an edge region of the substrate. The conductive structure may be a resonant structure. The apparatus may include a focus ring that has an insulating material with an annular shape defining an interior opening. The conductive structure may be embedded within the insulating material and be configured to generate the plasma along the annular shape and surrounding the interior opening. Processing conditions at the edge region of the substrate may be controlled using the plasma localized at the edge region.

20 Claims, 8 Drawing Sheets

(56) References Cited

U.S. PATENT DOCUMENTS

| | | | | |
|---|---|---|---|---|
| 2007/0215279 | A1* | 9/2007 | Koshiishi | H01J 37/32642 156/914 |
| 2008/0223873 | A1 | 9/2008 | Chen et al. | |
| 2009/0056629 | A1 | 3/2009 | Katz et al. | |
| 2010/0243606 | A1 | 9/2010 | Koshimizu et al. | |
| 2010/0243620 | A1* | 9/2010 | Yamawaku | H01J 37/32623 219/121.54 |
| 2013/0087285 | A1 | 4/2013 | Kofuji et al. | |
| 2015/0015140 | A1 | 1/2015 | Denning et al. | |
| 2015/0243488 | A1 | 8/2015 | Kubota et al. | |
| 2016/0322242 | A1* | 11/2016 | Nguyen | H01J 37/321 |
| 2016/0351404 | A1 | 12/2016 | Aramaki et al. | |
| 2017/0018411 | A1* | 1/2017 | Sriraman | H01J 37/32715 |
| 2017/0186587 | A1 | 6/2017 | Kawanabe et al. | |
| 2017/0301578 | A1* | 10/2017 | Hong | H01J 37/32862 |
| 2018/0092196 | A1 | 3/2018 | Notomi et al. | |
| 2018/0350566 | A1* | 12/2018 | Tobe | H01J 37/32642 |
| 2019/0006156 | A1* | 1/2019 | Seo | H05H 1/46 |
| 2019/0145001 | A1 | 5/2019 | Park et al. | |
| 2019/0206703 | A1 | 7/2019 | Zhoa et al. | |
| 2019/0228952 | A1* | 7/2019 | Dorf | H01L 21/6833 |
| 2019/0287758 | A1 | 9/2019 | Pan et al. | |
| 2020/0058469 | A1 | 2/2020 | Ranjan et al. | |
| 2021/0249233 | A1* | 8/2021 | Kajifusa | H01L 21/31116 |
| 2022/0084789 | A1 | 3/2022 | Takeuchi et al. | |

OTHER PUBLICATIONS

Babaeva, Natalia Y., “Penetration of plasma into the wafer-focus ring gap in capacitively coupled plasmas,” Journal of Applied Physics 101, 113307, Jun. 8, 2007, 11 pages.

Panagopoulos, Theodoros et al., “Three-dimensional simulation of an inductively coupled plasma reactor,” Journal of Applied Physics, vol. 91, No. 5, Mar. 1, 2002, 10 pages.

Yang, Kyung Chae, et al., “Effect of Structure and Material Variation of Focus Ring for Enhanced Etch Resistance,” Nanoscience and Nanotechnology Letters, vol. 9, 24-29, 2017, 6 pages.

International Searching Authority, “Notification of Transmittal of The International Search Report and The Written Opinion of The International Searching Authority,or The Declaration,” International application No. PCT/US2023/024838, Oct. 4, 2023, 10 pages.

* cited by examiner

APPARATUS FOR EDGE CONTROL DURING PLASMA PROCESSING

TECHNICAL FIELD

The present invention relates generally to plasma processing, and, in particular embodiments, to structures of apparatuses and methods for edge control during plasma processing.

BACKGROUND

Device formation within microelectronic workpieces may involve a series of manufacturing techniques including formation, patterning, and removal of a number of layers of material on a substrate. In order to achieve the physical and electrical specifications of current and next generation semiconductor devices with the desired throughput, processing equipment and methods that are able to maintain a high degree of uniformity across all regions of the substrate are desirable. As device structures densify and critical dimensions shrink, precise control over processing conditions is necessary because even small variations during processing may result in nonfunctional or malfunctional devices.

One particular region of a substrate that is prone to variations during processing is the edge region of the substrate. It is common for the central region of the substrate (as large as possible) to have the most uniform and controllable processing conditions. However, the edge region of the substrate is a perpetual area of difficulty due to discontinuities. For example, the edge region of the substrate has a material discontinuity as a result of the substrate terminating. Additionally, despite efforts otherwise, the edge region of the substrate also has an electrical discontinuity. Both the material discontinuity and the electrical discontinuity undesirably alter processing conditions in the edge region of the substrate relative to the central region of the substrate.

Plasma processing is a common technique for processing a substrate. Controlling various parameters such as radical flux and ion flux at the substrate is important to achieve the desired results with the desired throughput. Due to the material and electrical differences at the substrate edge, plasma generated at the substrate is different above the edge region compared to the plasma above the central region. Consequently, control over radicals and ions is difficult in the edge region. Moreover, any attempt to correct variations above the edge region must also avoid altering the desirable conditions above the central region. Therefore, apparatuses and methods that are able control conditions at the edge region of a substrate during plasma processing without adversely affecting conditions in the central region of the substrate may be desirable.

SUMMARY

In accordance with an embodiment of the invention, an apparatus for plasma processing includes a pedestal configured to support a substrate and a resonant structure disposed at the pedestal. The resonant structure is configured to generate a plasma localized at an edge region of the substrate.

In accordance with another embodiment of the invention, a focus ring includes an insulating material and a conductive structure embedded within the insulating material. The insulating material has an annular shape that defines an interior opening. The conductive structure is configured to generate a plasma localized along the annular shape and surrounding the interior opening.

In accordance with still another embodiment of the invention, a method of plasma processing includes generating a primary plasma at a substrate and controlling a flux of species to an edge region of the substrate by generating a secondary plasma localized at the edge region of the substrate using a resonant structure.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a cross-sectional view of the plasma processing apparatus and FIG. 1B illustrates a plan view of the plasma processing apparatus;

Figure 1A:
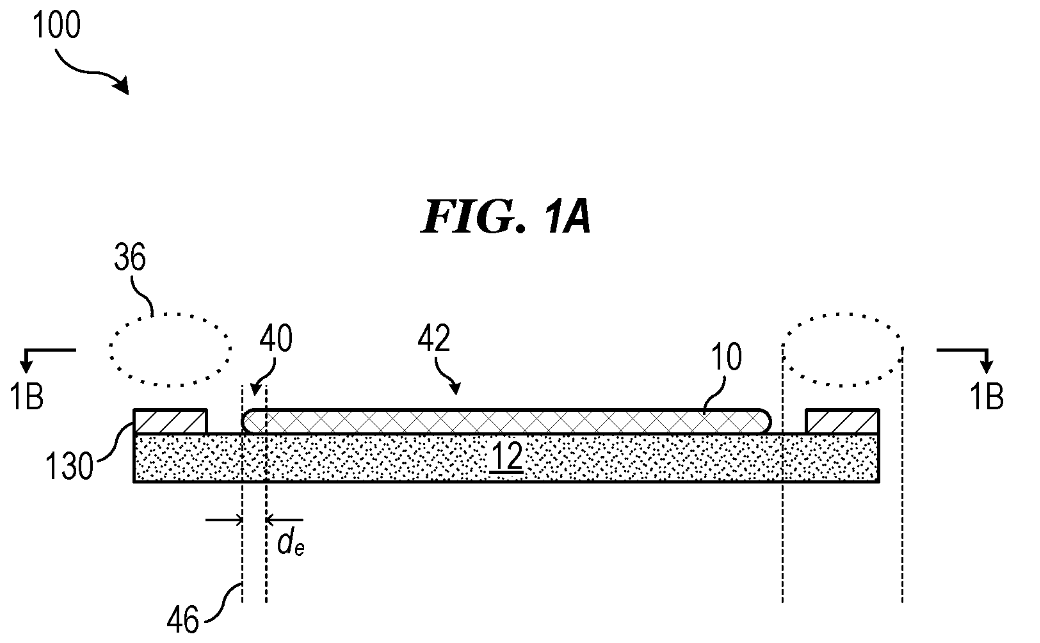
FIGS. 1A and 1B illustrate a schematic diagram of an example plasma processing apparatus including a pedestal and a conductive structure configured to generate a localized plasma in accordance with embodiments of the invention, where

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Conventional plasma processing apparatuses and methods of plasma processing are unable to adequately control plasma processing parameters at the edge region of a substrate (e.g. a wafer) relative to the central region. As a result, a significant number of dies in the edge region of the substrate acquire defects due to the differences in processing conditions. This, in turn, results in decreased device yield caused by non-uniform processing conditions at edge regions and an undesirable reduction in throughput.

Various strategies have been attempted to compensate for effects of the discontinuities at the edge region of the substrate. Some strategies involve modifying existing plasma processing apparatuses to generate a more uniform environment that can better tolerate the differences between the central region and the edge region of a substrate. However, modifying a plasma processing apparatus is undesirably costly, complicated, and requires extensive optimization for each plasma process in the new tool.

Focus rings have been utilized to improve uniformity of processing conditions across a substrate during plasma processing. For example, the focus ring may be coupled to bias power via the substrate support (e.g. an electrostatic chuck). However, because conventional focus rings have limited localized effects, the uniformity benefits afforded by conventional focus rings is insufficient to meet the demands of many plasma processing techniques, especially in complicated process flows and for larger wafer sizes.

For example, there are a number of problems with just coupling radio frequency (RF) to the focus ring. The ion energy and the ion flux of ions produced by the plasma above the focus ring are both increasing functions of the RF power to the focus ring. As a result, there is no independent control of them. Additionally, the hardware to control the amount of power to the focus ring, such as variable capacitors or inductors, is usually complex since it must handle live RF power. There is also usually minimal real estate free in the pedestal area and putting such hardware there is not trivial.

One option intended to increase the impact of a focus ring in the edge region of a substrate might be to increase the power provided to the focus ring relative to the substrate support by directly powering the focus ring. However, various drawbacks exist for this approach that cause this approach to be untenable. For instance, it may be difficult to apply direct power uniformly to the focus ring. Additionally, the direct power to the focus ring may be subject to crosstalk with the bias power provided to the substrate support. Another undesirable side effect of direct power to the focus ring may be sputtering caused by the use of relatively high power at a relatively low frequency.

The edge response (e.g. the local effects of discontinuities at the substrate edge) may also change when the power to the substrate support is changed. This makes it difficult or impossible to control conditions at the edge region by significantly changing the power supplied to the substrate support because the power modification may exacerbate the undesirable edge effects countering or reducing any beneficial effects.

Accordingly, embodiments described herein provide apparatuses and methods for plasma processing that control process conditions at an edge region of a substrate by generating a localized plasma at the edge region. Various process conditions may be controlled such as the flux of species at the edge region. A primary plasma may also be generated at the substrate. That is, the localized plasma may be generated in addition to the primary plasma.

The localized plasma may be generated using a conductive structure. For example, the conductive structure may be a resonant structure. The conductive structure may be located near the edge region of the substrate. For example, the conductive structure may be attached to or included in a pedestal supporting the substrate (e.g. a wafer). In various embodiments, the conductive structure is included as part of a focus ring surrounding the substrate and supported by a pedestal.

The conductive structure is embedded in the focus ring in some embodiments. For example, the conductive structure may be embedded within an insulating material of a focus ring that has an annular shape defining an interior opening of a focus ring. The conductive structure may then be configured to generate the localized plasma along the annular shape.

The embodiment apparatuses and methods described herein may provide various advantages over conventional techniques. Control over process conditions at the edge region may be advantageously facilitated without modifications to existing plasma processing apparatuses. For example, including a conductive structure (e.g. a resonant structure) in an existing pedestal (e.g. embedded in a focus ring) and supplying power to the conductive structure through the pedestal may advantageously allow other aspects of a given plasma processing apparatus to remain the same. As a result, edge region control may be achieved while avoiding expensive, complicated, and time-consuming tool modifications.

In some embodiments, the localized plasma may be generated by applying high frequency power to a pedestal supporting a substrate in addition to bias power supplied to the pedestal. The use of high frequency power may provide the benefit of reducing sputtering that may otherwise occur if lower frequency power is used. High frequency power may also reduce the undesirable global side effects (e.g. to the central region of the substrate or to the primary plasma) of generating the localized plasma.

The embodiments described herein may also generate a localized plasma with improved efficiency. For example, in various embodiments, localized plasma generation using a resonant structure may be accomplished with advantageously low voltage. Additionally, since the resonant frequency of the resonant structure can be influenced by design parameters such as geometry and choice of materials, the resonant structure may be designed such that power may be coupled to the resonant structure while also beneficially reducing or eliminating passive coupling with applied bias power.

The resonant structure may advantageously generate strong electromagnetic fields that are localized to the vicinity of the resonant structure. For example, coupling an auxiliary power at a different frequency using an inductive coupling method may have a minimal effect on the ion energy. Thus, it may be possible to produce a higher plasma density without increasing the ion energy. This field enhancement afforded by the resonant structure may provide the advantage of generating a highly localized plasma at the edge region without significantly affecting global process conditions (e.g. affecting a primary plasma or the central region of the substrate. That is, the concentrated electromagnetic fields may advantageously produce a higher degree of control that is more spatially confined than conventional techniques.

Various embodiments described herein may utilize geometries of conductive structures that advantageously generate a uniform plasma localized at the edge region of the substrate while maintaining a small footprint. For example, a configuration including a series of spiral segments arranged in an annular shape (e.g. within a focus ring) may be used to locally generate a uniform plasma at the edge region without altering the footprint of existing plasma processing apparatuses.

Figure 1B:
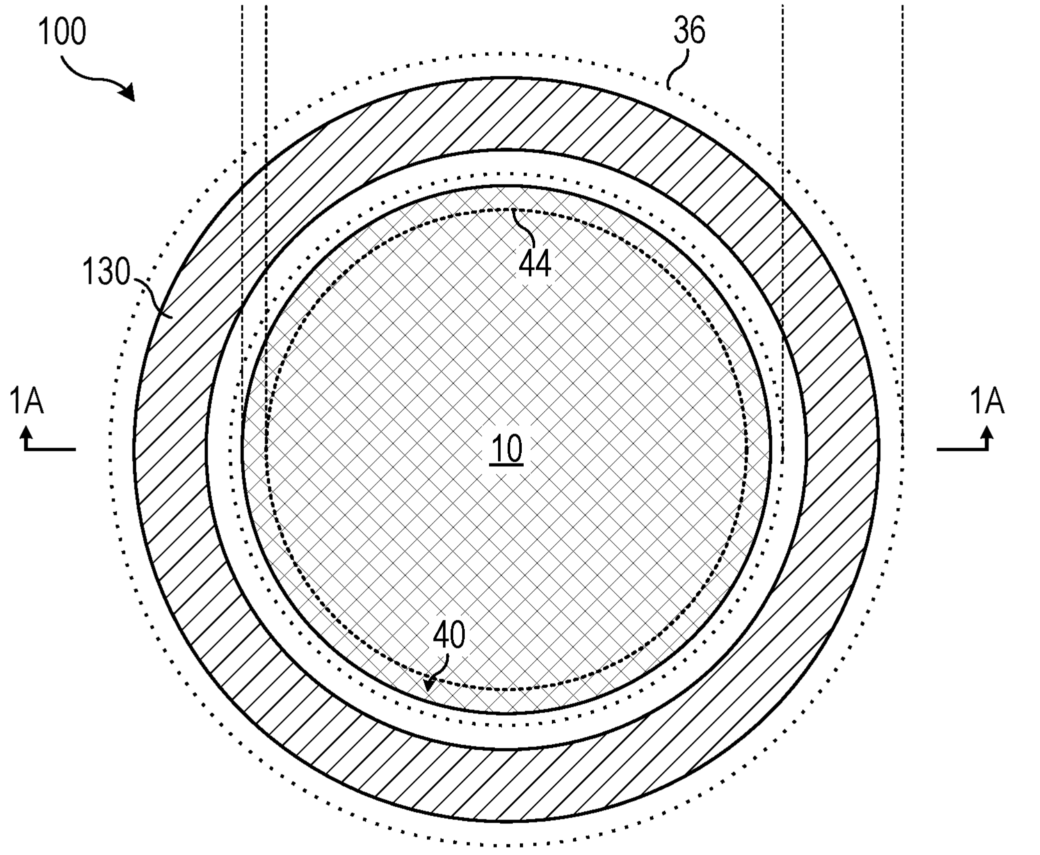

Embodiments provided below describe various apparatuses and methods for plasma processing, and in particular, apparatuses and methods for plasma processing that control processing conditions in an edge region of a substrate by generating a plasma localized at the edge region. The following description describes the embodiments. FIGS. 1A and 1B are used to describe an example plasma processing apparatus. Another example plasma processing apparatus is described using FIG. 2. An example conductive structure is described using FIG. 3 while FIG. 4 is used to describe and example focus ring including an embedded conductive structure. Three portions of an example plasma processing apparatus depicting methods of controlling process conditions in an edge region of a substrate are described using FIGS. 5-7. Two timing diagrams of example plasma processing methods are described using FIGS. 8 and 9. An example method of plasma processing is described using FIG. 10.

FIGS. 1A and 1B illustrate a schematic diagram of an example plasma processing apparatus including a pedestal and a conductive structure configured to generate a localized plasma in accordance with embodiments of the invention, where FIG. 1A illustrates a cross-sectional view of the plasma processing apparatus and FIG. 1B illustrates a plan view of the plasma processing apparatus.

Referring to FIGS. 1A and 1B, a plasma processing apparatus 100 includes a pedestal 12 that is configured to support a substrate 10. Due to discontinuities in the properties of the substrate 10 at the outer edge 46, processing conditions in an edge region 40 of the substrate 10 are different than processing conditions in a central region 42 of the substrate 10. For example, the electrical properties at the edge region 40 are different them the central region 42.

A localized plasma 36 is generated using a conductive structure 130. The localized plasma 36 is localized at the edge region 40. That is, the conductive structure 130 is configured to generate plasma that is in the vicinity of and capable of influencing the edge region 40 of the substrate 10 without substantially affecting the central region 42.

In one embodiment, the conductive structure 130 is a resonant structure. In one embodiment, the conductive structure 130 is an embedded structure. The conductive structure 130 may be located in the vicinity of the edge region 40. In various embodiments, the conductive structure 130 is disposed at the pedestal 12 and is directly contacting the pedestal 12 in one embodiment. The conductive structure 130 may be configured to surround the substrate 10. For example, in some embodiments, the conductive structure 130 is included as part of a focus ring that is supported by the pedestal 12. The conductive structure 130 is embedded within a focus ring in one embodiment.

The conductive structure 130 is configured to generate the localized plasma 36 such that it causes local effects in the edge region 40. Consequently, properties of the localized plasma 36, such as shape, extent, and proximity to the edge region 40, may depend on the specific details of the conductive structure 130 and/or the specific size and shape of the substrate 10 and the edge region 40. For example, in the specific configuration depicted in FIGS. 1A and 1B, the localized plasma 36 has a toroidal shape that is located above the conductive structure 130. However, localized plasmas with other shapes and positions are also possible and may be tailored to meet the design goals of a given application. For example, flat panel displays are rectangular (and can be large) so control of the plasma at the panel edge may be advantageous.

Advantageously, the plasma processing apparatus 100 may be used to control process conditions in the edge region 40 using the conductive structure 130 to generate plasma localized at the edge region 40. For example, a primary plasma may be generated in the vicinity of the substrate 10. Due to the discontinuities at the outer edge 46, the effects of the primary plasma may be different in the edge region 40 when compared to the central region 42.

Therefore, it may be useful to be able to selectively produce the localized plasma 36 (e.g. a secondary plasma in the specific case including a primary plasma) at the edge region 40 (e.g. at a region near the edge of a wafer). Because the localized plasma 36 is limited in extent and effect to the edge region 40, process conditions such as the flux of species to the edge region 40 may be controlled. For example, ion fluxes and radical fluxes to the edge region 40 may advantageously be selectively controlled.

The edge region 40 includes the portion of the substrate 10 that extends an edge distance de between the outer edge 46 and an edge boundary 44. The edge boundary 44 qualitatively indicates the transition between substantially uniform processing conditions in the central region 42 and difference in the processing conditions in the edge region 40. The edge distance de may depend on details of a given plasma processing method, plasma processing apparatus, and substrate being processed. The edge region 40 represents a region including the outer edge 46 of the substrate 10 that experiences different processing conditions than the central region 42 of the substrate 10. That is, processing conditions during a given plasma process are uniform to within a given tolerance in the central region 42, but deviate outside the tolerance in the edge region 40.

The edge distance de is less than about 5% of the diameter of the substrate 10 (e.g. less than about 15 mm for a 300 mm wafer) in various embodiments. In some embodiments, the edge distance de is less than about 2.5% of the diameter of the substrate 10 (e.g. about 7.5 mm for a 300 mm wafer). In one embodiment, the edge distance de is about 5 mm and the diameter of the substrate 10 is about 300 mm (e.g. about 3.3% of the diameter). Even the area of this last 5 mm is about 94 $cm^2$ making it valuable real estate from a yield perspective.

In some implementations, the edge region 40 coincides with the so-called extreme edge region of the substrate. For example, the last 5 mm of a 300 mm wafer may be considered the extreme edge region of the wafer. Despite being a relatively small portion of the substrate, the extreme edge region may still include a large number of dies, such as approximately 100 dies in this example (the exact number depends on a variety of factors, such as wafer size and the die size itself). As a result, improving the yield in the extreme edge by locally controlling processing conditions has the benefit of enabling a desirable improvement in the overall yield of the substrate.

The substrate 10 may be any suitable substrate, such as a semiconductor substrate, dielectric substrate, or metal substrate, for example. In one embodiment, the substrate 10 is a wafer substrate. In various embodiments, the substrate 10 has a diameter greater than about 150 mm. In some embodiments, the substrate 10 has a diameter greater than about 300 mm. For example, the diameter of the substrate 10 may be about 150 mm, 200 mm, 300 mm, 450 mm, or even larger. One example of a larger substrate might be a flat panel display.

Figure 2:
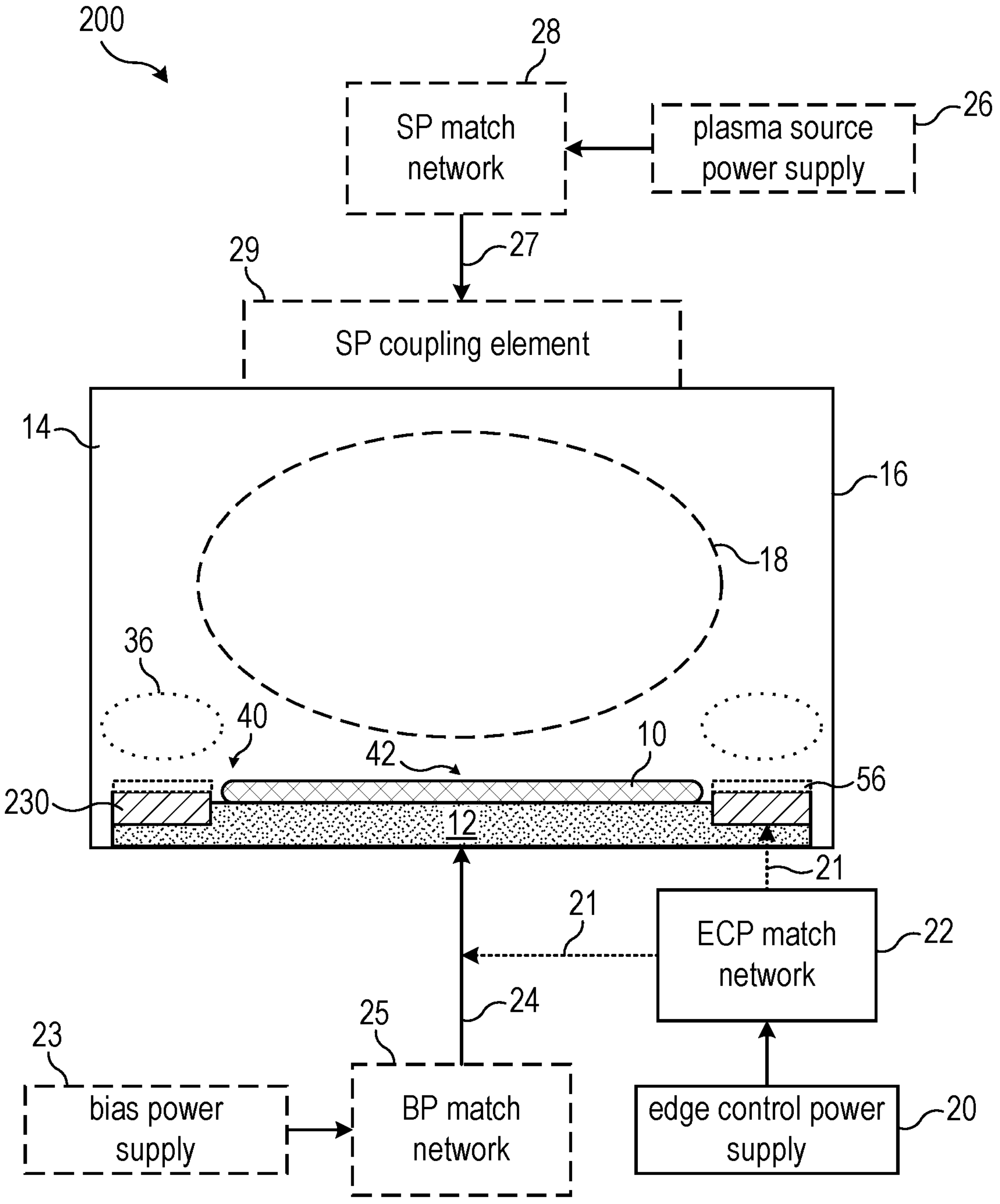
FIG. 2 illustrates a schematic diagram of an example plasma processing apparatus including an edge control power supply coupled to a conductive structure configured to generate a localized plasma in accordance with embodiments of the invention.

FIG. 2 illustrates a schematic diagram of an example plasma processing apparatus including an edge control power supply coupled to a conductive structure configured to generate a localized plasma in accordance with embodiments of the invention. The plasma processing apparatus of FIG. 2 may be a specific implementation of other plasma processing apparatuses described herein such as the plasma processing apparatus of FIG. 1, for example. Similarly labeled elements may be as previously described.

Referring to FIG. 2, a plasma processing apparatus 200 includes a pedestal 12 disposed within a chamber 14. The pedestal 12 is configured to support a substrate 10. A localized plasma 36 is generated in the chamber 14 at an edge region 40 of the substrate 10 using a conductive structure 230 (e.g. a resonant structure).

It should be noted that here and in the following a convention has been adopted for brevity and clarity wherein elements adhering to the pattern [x10] may be related implementations of an element in various embodiments. For example, the conductive structure 230 may be similar to the conductive structure 130 except as otherwise stated. An analogous convention has also been adopted for other elements as made clear by the use of similar terms in conjunction with the aforementioned three-digit numbering system.

The plasma processing apparatus 200 also includes an edge control power supply 20 coupled to the conductive structure 230 that is configured to supply edge control power 21 (ECP) to the conductive structure 230. The edge control power supply 20 is coupled to the conductive structure 230 through an ECP match network 22 configured to perform impedance matching functions. The edge control power 21 may be coupled directly to the conductive structure 230 (upper arrow) of may be coupled to the conductive structure 230 through the pedestal 12 (left arrow).

In some embodiments, the edge control power supply 20 is an alternating current (AC) power supply and is an RF power supply in one embodiment. The edge control power supply 20 may be configured to provide RF power at a certain frequency or range of frequencies. In one embodiment, the edge control power supply 20 is a very high frequency (VHF) power supply (e.g. capable of supplying RF power at one or more frequencies within the range of about 30 MHz to about 300 MHz). In another embodiment, the edge control power supply 20 is an ultra high frequency (UHF) power supply (e.g. capable of supplying RF power at one or more frequencies within the range of about 300 MHz to about 3 GHz). However, other frequencies are also possible.

Bias power 24 (BP) may be optionally supplied to the pedestal 12. For example, a bias power supply 23 (e.g. an RF power supply) may be coupled to the pedestal 12 and be configured to supply the bias power 24 to the pedestal 12 through a BP match network 25 as shown. In one embodiment, the bias power supply 23 is a high frequency (HF) power supply (e.g. capable of supplying RF power at one or more frequencies up to about 30 MHz). When the edge control power 21 is directly coupled to the pedestal 12, the edge control power 21 may be combined with the bias power 24 and provided to the pedestal 12 together. That is, the edge control power supply 20 may be configured to superimpose the edge control power 21 onto the bias power 24 supplied to the pedestal 12 by the bias power supply 23 so that the edge control power 21 is carried to the conductive structure 230 by the pedestal 12.

For example, the edge control power 21 may be connected to a feed line carrying the bias power 24 to superimpose the edge control power 21 onto the bias power 24. Other methods of superimposing the edge control power 21 on the bias power 24 are also possible such as connecting the edge control power 21 with the bias power 24 at the pedestal 12 or connecting both the edge control power 21 and the bias power 24 to the pedestal 12 separately so that they are superimposed within the pedestal 12. Superimposing the edge control power 21 onto the bias power 24 may carry the advantage of allowing the localized plasma 36 to be generated without any modifications to an existing plasma processing apparatus other than including the conductive structure 230 and connecting the edge control power supply 20 and ECP match network 22 to an existing bias power 24 feed line.

Alternatively, the edge control power 21 may be optionally supplied directly to the conductive structure 230 (e.g. within a focus ring) without specifically coupling to the main RF power train that carries the bias power 24 to the pedestal 12. Although this may be advantages in some scenarios, it may also have greater hardware complexities.

The bias power supply 23 may be configured to provide RF power at a certain frequency or range of frequencies. For example, the bias power supply 23 may be configured to supply the bias power 24 to the pedestal 12 at a bias power frequency $f_{BP}$. The frequency $f_{BP}$ may be less than 30 MHz in one embodiment.

Similarly, the edge control power supply 20 may be configured to supply the edge control power 21 at an edge control power frequency $f_{EC}$. In some embodiments, the frequency $f_{EC}$ is greater than the frequency $f_{BP}$. For example, the edge control power supply 20 may be configured to supply the edge control power 21 at a frequency $f_{EC}$ that is greater than or equal to 30 MHz. In various embodiments, the frequency $f_{EC}$ is between and 100 MHz, and about 500 MHz. In some embodiments, the frequency $f_{EC}$. is between and 100 MHz, and about 400 MHz. In one embodiment, the frequency $f_{EC}$. is about 100 MHz.

Sputtering can occur when applying lower frequency power. Therefore, supplying edge control power 21 at a higher frequency (e.g. greater than or equal to 30 MHz) may provide the benefit of reducing or eliminating sputtering when generating the localized plasma 36. Additionally, passive coupling between power applied to the pedestal and power applied to the conductive structure 230 (e.g. a resonant structure embedded within a focus ring) may be advantageously reduced or avoided by supplying the edge control power 21 at the higher frequency directly to the pedestal supporting the conductive structure 230.

A primary plasma 18 may be optionally generated in the chamber 14. The primary plasma 18 may be the main plasma for processing the substrate 10. For example, the primary plasma 18 may be the primary source of species within the chamber 14 such as radicals and ions. Source power 27 (SP) may be optionally supplied to an SP coupling element 29 configured to generate the primary plasma 18 within the chamber 14. A source power supply 26 (e.g. an RF power supply) may be configured to supply the source power 27 to the SP coupling element 29 through an SP match network 28 as shown.

Plasma generated in the plasma processing apparatus 200 (i.e. the primary plasma 18) is sensitive to the properties of nearby materials. As a result, plasma above the edge region 40 may be different than plasma above the central region 42. The localized plasma 36 may advantageously act as a secondary plasma that affords the control to counteract the differences in the plasma above the edge region 40 while avoiding significant effects on the properties of the plasma above the central region 42.

The primary plasma 18 may be generated using any suitable SP coupling element 29. In one embodiment, the SP coupling element 29 is disposed at the top of the chamber 14 (as shown), but other configurations are also possible. For example, the SP coupling element 29 may also be disposed at a side or at the bottom of the chamber 14. The SP coupling element 29 may be a helical resonator source, inductively coupled plasma (ICP) source, capacitively coupled plasma (CCP) source, surface wave plasma (SWP) source, and the like. Additionally, there is no requirement that the SP coupling element 29 be separate from the pedestal 12. For example, the source power may be mixed with bias power and introduced to the pedestal 12 from below.

Sill referring to FIG. 2, the chamber 14 includes chamber walls 16 enclosing the pedestal 12. Chamber walls may refer to any combination of sidewalls, floor, or ceiling of the chamber 14. The chamber 14 may be any chamber suitable for plasma processing, such as a vacuum chamber.

The pedestal 12 may be any suitable type of substrate support or substrate holder. For example, in some embodiments, the pedestal 12 is a wafer chuck and is an electrostatic wafer chuck in one embodiment. In implementations including the bias power 24, the pedestal 12 is also configured to couple the bias power 24 that is supplied to the pedestal 12 to plasma within the chamber 14. The pedestal 12 may be integrated with the chamber walls 16 (e.g. integrated with or resting on the floor of the chamber 14) or may be separated from the chamber walls 16 (e.g. raised up above the floor of the chamber 14 on a pillar).

An optional top cover 56 may be included at the conductive structure 230. The optional top cover 56 may be configured to protect the conductive structure 230 and/or to reduce contamination by the conductive structure 230 during plasma processing. For example, the conductive structure 230 may be embedded in a focus ring made of an insulating material. Without the optional top cover 56, the focus ring may be prone to producing etch by products and/or quickly wearing out. This may be due to a variety of processes such as chemical etching or ion bombardment. The focus ring including the conductive structure 230 would likely be sufficiently expensive so as to not be considered disposable (unlike cheaper conventional focus rings). Therefore, the optional top cover 56 may advantageously reduce cost by extending the life of the conductive structure 230 within the plasma processing apparatus 200.

The optional top cover 56 may also advantageously reduce discontinuities between the substrate 10 and the conductive structure 230. For example, the substrate 10 may be silicon while the conductive structure 230 may be embedded in a different material such as quartz or silicon carbide. Although possible, embedding the conductive structure 230 in silicon may have the disadvantage of being prohibitively difficult or costly. The optional top cover 56 may then enable a chosen material (silicon or any other material) to cover the conductive structure 230 and any additional materials in which it is embedded.

In a specific example, the conductive structure 230 may be embedded in an insulating material. The optional top cover 56 may be disposed over the insulating material. The optional top cover 56 may include a different material than the insulating material. For example, the chemical and physical properties of the optional top cover 56 may be different from those of the insulating material. The optional top cover 56 may be thin. For example, in one embodiment, the optional top cover 56 is thinner than the insulating material.

In various embodiments, the optional top cover 56 is a ceramic material. The insulating material may also be a ceramic material, but may be a different ceramic material. In one embodiment, the optional top cover 56 is formed by co-firing a first ceramic material of the insulating material along with a second ceramic material of the optional top cover 56. For example, the optional top cover 56 may be silicon carbide, silicon nitride, etc.

In another embodiment, the optional top cover 56 is a thermal spray coating. As one example, the optional top cover may be formed using a flame spray technique. Many materials may be suitable for flame spray deposition, such as yttria, zirconia, and others. The optional top cover 56 may also be formed by modifying a top region of the insulating material using various techniques such as ion implantation.

Figure 3:
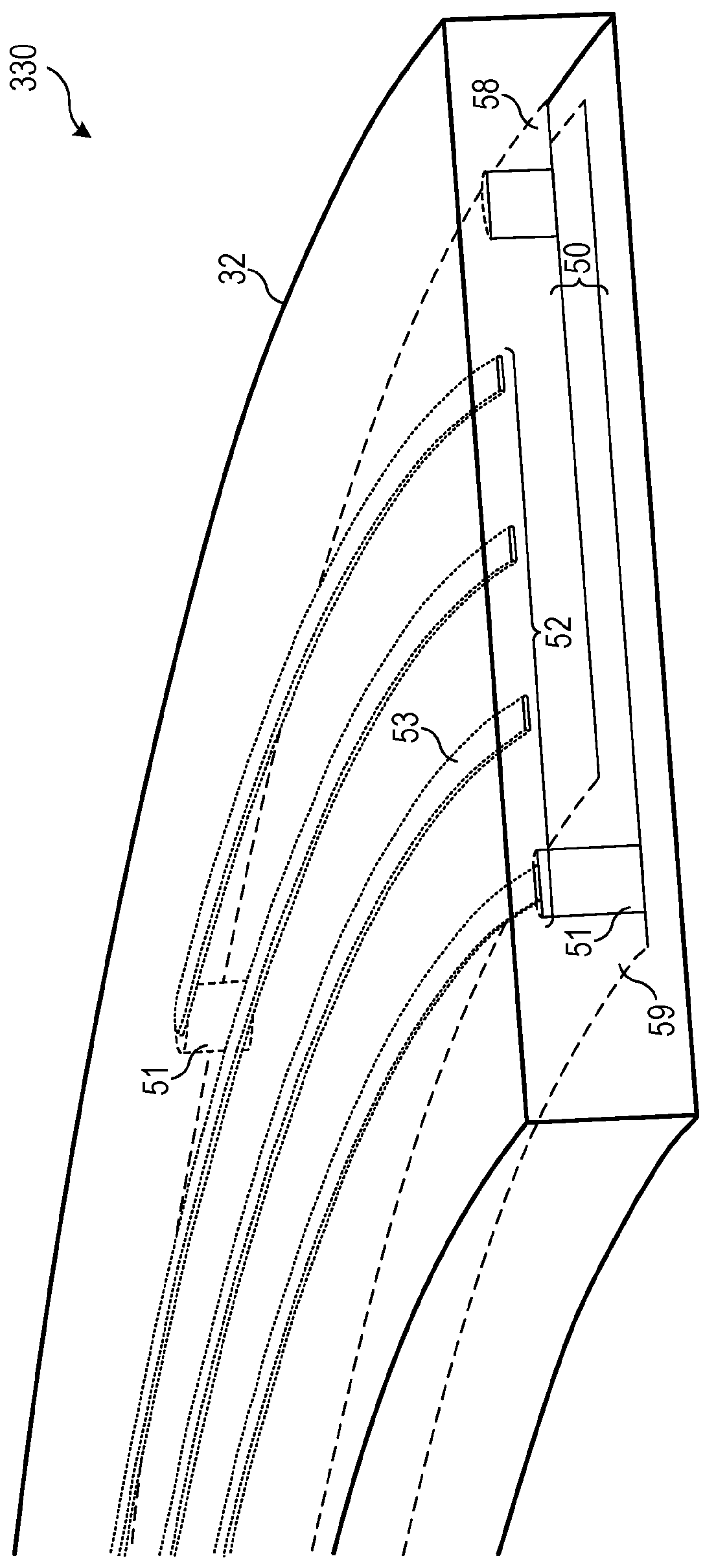
FIG. 3 illustrates a cross-sectional view of a portion of an example conductive structure embedded in an insulating material in accordance with embodiments of the invention.
Figure 4:
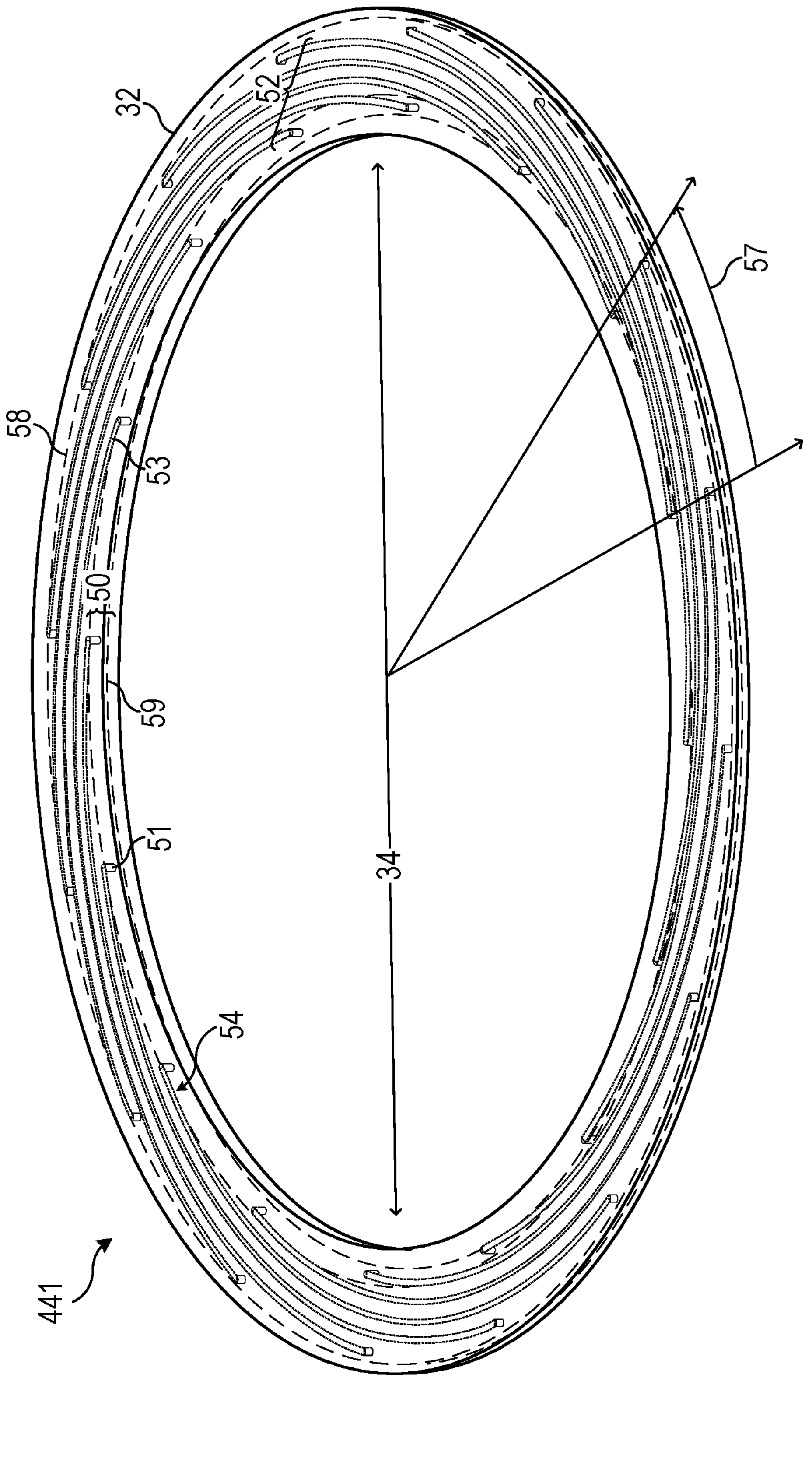
FIG. 4 illustrates an example focus ring that includes an embedded conductive structure in accordance with embodiments of the invention.

FIG. 3 illustrates a cross-sectional view of a portion of an example conductive structure embedded in an insulating material in accordance with embodiments of the invention. The conductive structure of FIG. 3 may be a specific implementation of other conductive structures described herein such as the conductive structure of FIG. 1, for example. Similarly labeled elements may be as previously described.

Referring to FIG. 3, a conductive structure 330 is embedded in an insulating material 32. The conductive structure 330 is a resonant structure configured to generate high electromagnetic fields localized to the vicinity of the conductive structure. For example, driving the conductive structure 330 at the appropriate resonant frequency may cause a field enhancement. The resonant quality of the conductive structure 330 may advantageously generate a plasma localized at an edge region of a substrate without significantly affecting process conditions at a central region of the substrate (e.g. controlled by a primary plasma).

Due to the enhanced effects of applying power to the conductive structure 330 at a resonant frequency, the application of edge control power to the conductive structure 330 has a desirably diminished effect on other aspects of the plasma process, such as the application of source power and bias power to a plasma processing apparatus. Consequently, another potential advantage of using a resonant structure is that minor modifications to an existing plasma processing apparatus may be sufficient to achieve the benefits of being able to control process conditions in the edge region of a substrate. This may be important, for example, because it can be very expensive to modify a chamber since doing so may change processes so that they must be redeveloped.

The conductive structure 330, which is a resonant structure in this case, includes an inductive structure 52 and an capacitive structure 50. For example, the inductive structure 52 is overlying the capacitive structure 50 in one embodiment. However, in other embodiments, the inductive structure 52 may be positioned under or in substantially the same plane as the capacitive structure 50.

The inductive structure 52 is electrically coupled to the capacitive structure 50 such that a resonant LC (inductor-capacitor) circuit is formed. The capacitive structure is formed from a top plate 58 and a bottom plate 59 in a parallel plate capacitor configuration, although other capacitive structures are of course possible. Some other structures may include additional plates and/or alter the orientation of the plates. For instance, one alternative configuration may include multiple parallel plates interleaved with each other. The purpose of including multiple plates may be to reduce the resonant frequency which scales with the inverse square root of the capacitance (which in turn scales with the area of the plates). Vertical or angled plates are also possible.

The inductive structure 52 includes a series of adjacent conductive strips 53 disposed over the top plate 58. Each of the conductive strips 53 are electrically coupled at one end to the top plate 58 and at another end to the bottom plate 59 using conductive posts 51. For example, the conductive posts 51 may be conductive vias. The conductive strips 53 carry current between the top plate 58 and the bottom plate 59.

The insulating material 32 may be any suitable material. In various embodiments, the insulating material 32 is a ceramic material. In one embodiment, the insulating material is alumina. For example, the insulating material 32 may be an alumina matrix. In other embodiments, the insulating material 32 may be another material such as a polymer material, a resin material, quartz, silicon, yttria, or a composite material (e.g. a material used for printed circuit boards), among others.

Various materials may afford different advantages in different situations. For instance, silicon, quartz, silicon carbide, and sapphire (crystalline alumina) may provide enhanced chemical resistance for certain plasma processes. Sapphire may also provide the benefit of low contamination. Silicon nitride may provide additional thermal conductivity, which may be beneficial if it is desirable to heat or cool the substrate. In this way, the choice of insulating material 32 may be application specific.

As shown, the conductive structure 330 is an embedded structure. Any suitable method may be used to fabricate such a structure and may depend on the chosen materials and the specific details of a given plasma process. One method of fabricating the conductive structure 330 is to cut holes in sheets of ceramic in their green state and print a thin conductive pattern on the sheets. The holes may be used for the conductive posts 51 while the printed pattern may form the conductive strips 53, the top plate 58, and the bottom plate 59 on various sheets of ceramic. The sheets may then be arranged in a sandwich configuration and fired to form the structure. This method may be suitable when the insulating material 32 is alumina and the conductive strips 53, top plate 58, and bottom plate 59 are platinum. However, other combinations are possible.

Other methods of fabricating the conductive structure 330 may be to use multilayer printed circuit board fabrication process (e.g. copper on FR-4) or to build the structure layer-by layer using patterning and deposition techniques.

FIG. 4 illustrates an example focus ring that includes an embedded conductive structure in accordance with embodiments of the invention. The focus ring of FIG. 4 may be usable in the plasma processing apparatuses as described herein such as the plasma processing apparatus of FIG. 1, for example. The focus ring of FIG. 4 may be a specific embodiment of the conductive structure embedded in an insulating material of FIG. 3. Similarly labeled elements may be as previously described.

Referring to FIG. 4, a focus ring 441 includes a conductive structure embedded in an insulating material 32 that has an annular shape defining an interior opening 34 (e.g. a circular opening). The insulating material 32 of the focus ring 441 is configured to surround a substrate located in the interior opening 34. The conductive structure is configured to generate a plasma localized along the annular shape and surrounding the interior opening 34. In this specific example, the conductive structure comprises an inductive structure 52 overlying a capacitive structure 50.

The capacitive structure 50 includes a top plate 58 and a bottom plate 59 arranged in a parallel plate capacitor configuration. Each of the top plate 58 and the bottom plate 59 have an annular shape that follows the annular shape of the insulating material 32.

Conductive strips 53 form a series of spiral segments 54. The inductive structure 52 includes (e.g. is formed by) the series of spiral segments 54. Each of the series of spiral segments has one end electrically connected to the top plate 58, and another end electrically connected to the bottom plate 59. For example, conductive posts 51 may be used to connect the series of spiral segments 54 to the top plate 58 and the bottom plate 59.

As shown in FIG. 4, the conductive strips 53 are arranged adjacent to each other in a spiral geometry. The center portion of the spirals is not present resulting in spiral segments that follow the annular shapes of the top plate 58 and bottom plate 59.

The precise arrangement of the capacitive structure 50 and the inductive structure 52 may depend on several variables such as the desired frequency and power used to generate the localized plasma. As the distance between the top plate 58 and the bottom plate 59 becomes smaller, there may be increased capacitance resulting in lower resonant frequency. In one embodiment, the distance between the top plate 58 and the bottom plate 59 is about 1 mm. However, other distances are possible and will depend on the specific details of a given application.

The inductive structure 52 also has variables that affect the performance of the focus ring 441. For example, the number of conducting strips 53 and the length of the conducting strips 53 may affect the resonant frequency. Longer conductive strips may lower the resonant frequency, which can be advantageous because it may be more expensive to provide power at higher frequencies.

The density of the conductive strips 53 may also be a consideration. The closer the conductive strips 53 are to one another, the more the inductive structure will approximate a conductive sheet. As a result, too much density may diminish the distance that the electromagnetic field leaks out and result in a localized plasma that does not sufficiently influence the process conditions in the edge region of the substrate. Conversely, conductive strips 53 that are too far apart may also produce a weaker effect. Therefore, the optimal spacing may depend on the specific details of a given application.

In one embodiment, the conductive strips 53 have a finite rotational symmetry (as illustrated). That is, the inductive structure 52 has a rotational symmetry of an order greater than 1 so that if the entire structure is rotated through an angle (shown here as arrow 57) equal to $2\pi$ divided by an integer greater than 1 about an axis passing through the center of the focus ring 441, the structure appears unchanged. In this particular example, the inductive structure 52 including the conductive strips 53 has a rotational symmetry of order 16. Rotational symmetry may advantageously facilitate an azimuthal symmetry in the production of a localized plasma.

Figure 5:
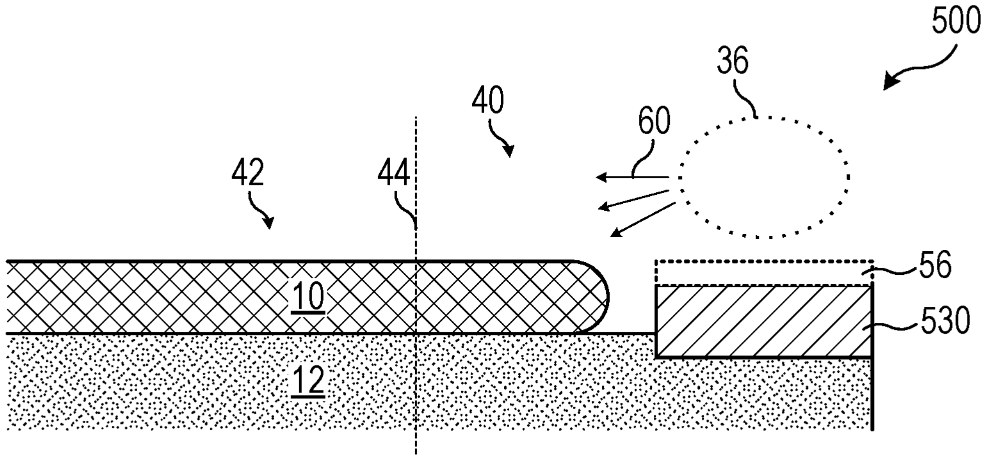
FIG. 5 schematically illustrates a cross-sectional view of a portion of a plasma processing apparatus in which a localized plasma is used to generate species at an edge region of a substrate in accordance with embodiments of the invention.

FIG. 5 schematically illustrates a cross-sectional view of a portion of a plasma processing apparatus in which a localized plasma is used to generate species at an edge region of a substrate in accordance with embodiments of the invention. The plasma processing apparatus of FIG. 5 may be a specific implementation of other plasma processing apparatuses described herein such as the plasma processing apparatus of FIG. 1, for example. Similarly labeled elements may be as previously described.

Referring to FIG. 5, a portion of a plasma processing apparatus 500 includes a substrate 10, a pedestal 12, and a conductive structure 530. As before, an optional top cover 56 may be included covering some or all of the conductive structure 530. For example, the optional top cover 56 may be a coating over a focus ring that includes the conductive structure 530. The focus ring may be supported by or attached to the pedestal 12, for example.

Process conditions in the edge region 40 may be difficult or impossible to control on a macro level (e.g. at the scale of the entire substrate) because of the discontinuities (e.g. material and electrical) caused by the edge of the substrate 10. For example, at the extreme edge of a wafer, it may be impossible to achieve satisfactory radical and ion control.

The conductive structure 530 is configured to generate a localized plasma 36 that generates a localized flux 60 of species to the edge region 40. For example, the species generated by the localized plasma 36 may include ions and radicals. A benefit of the localized nature of the localized flux 60 is to direct ions and radicals selectively to the edge region 40 (and not all the way past the edge boundary 44 to the central region of the substrate 10 where process conditions are controllable on a macro scale).

Figure 6:
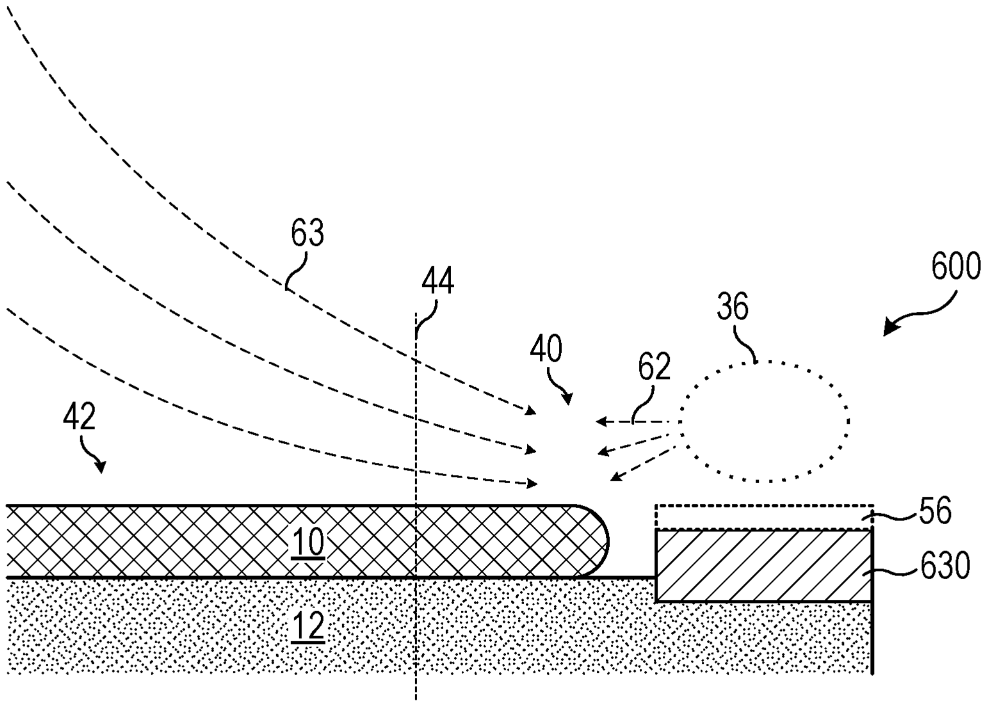
FIG. 6 schematically illustrates a cross-sectional view of a portion of a plasma processing apparatus in which a localized plasma is used to generate radicals at an edge region of a substrate in accordance with embodiments of the invention.

FIG. 6 schematically illustrates a cross-sectional view of a portion of a plasma processing apparatus in which a localized plasma is used to generate radicals at an edge region of a substrate in accordance with embodiments of the invention. The plasma processing apparatus of FIG. 6 may be a specific implementation of other plasma processing apparatuses described herein such as the plasma processing apparatus of FIG. 1, for example. Similarly labeled elements may be as previously described.

Referring to FIG. 6, a portion of a plasma processing apparatus 600 includes a substrate 10, a pedestal 12, and a conductive structure 630 that is configured to generate a localized plasma 36 that generates a flux of radicals 62 localized to the edge region 40 of the substrate 10. Additionally, a neutral flux 63 may also be generated, (e.g. by a neutral gas injected in the center of the chamber) which passes first over the central region 42 of the substrate 10 and then over the edge region 40.

The path of the airflow toward the edges of the substrate 10 may allow improved localization of the flux of radicals 62 to the edge region 40. That is, left alone, the flux of radicals 62 may diffuse into the central region 42 of the substrate 10 on a length scale determined by a diffusion coefficient and the reactivity of nearby neutrals. This length scale may at times be larger than the width of the edge region 40 (e.g. 5 mm). It may then be desirable to enhance the localization of the flux of radicals 62 to the edge region 40 to minimize influencing the central region 42. This may be achieved, using the outwardly directed flow of the neutral flux 63 (including, for example, mostly ground state species) which acts against the inward diffusion of the flux of radicals 62 produced by the localized plasma by colliding with the radicals and pushing them outward. By applying edge control power to the conductive structure 630 the flux of radicals 62 to the edge region 40 can be controlled.

Figure 7:
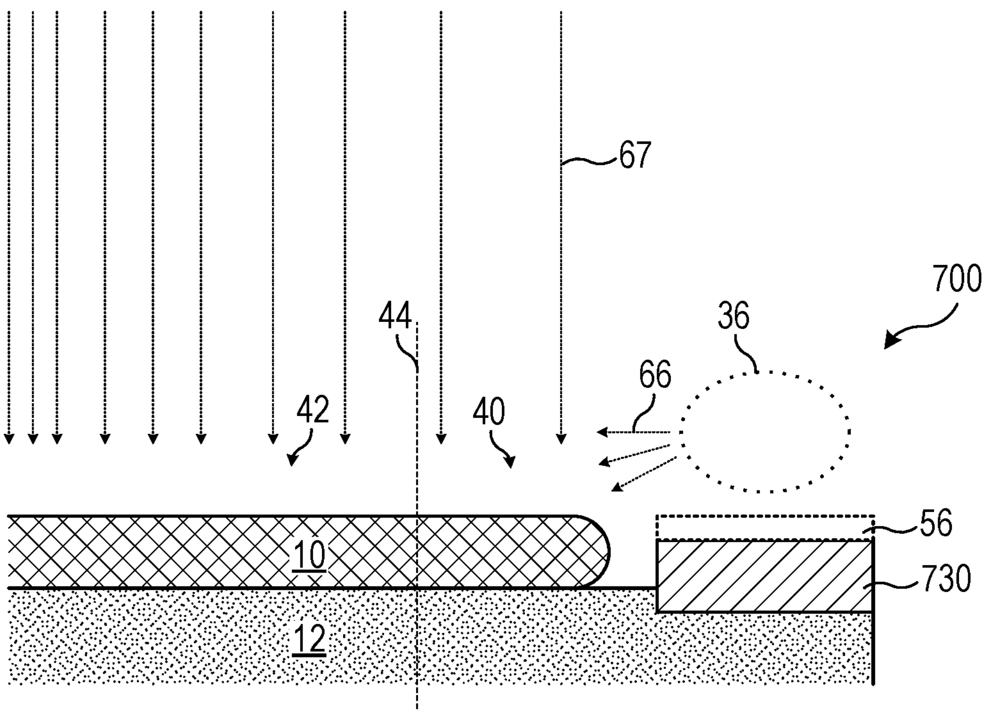
FIG. 7 schematically illustrates a cross-sectional view of a portion of a plasma processing apparatus in which a localized plasma is used to generate ions at an edge region of a substrate in accordance with embodiments of the invention.

FIG. 7 schematically illustrates a cross-sectional view of a portion of a plasma processing apparatus in which a localized plasma is used to generate ions at an edge region of a substrate in accordance with embodiments of the invention. The plasma processing apparatus of FIG. 7 may be a specific implementation of other plasma processing apparatuses described herein such as the plasma processing apparatus of FIG. 1, for example. Similarly labeled elements may be as previously described.

Referring to FIG. 7, a portion of a plasma processing apparatus 700 includes a substrate 10, a pedestal 12, and a conductive structure 730 that is configured to generate a localized plasma 36 that generates a flux of ions 66 localized to the edge region 40 of the substrate 10. Additionally, a primary ion flux 67 may also be generated (e.g. by applying bias power to the pedestal 12). The majority of the primary ion flux 67 impinges on the central region 42 of the substrate 10. For example, as shown, fewer ions may be available for acceleration towards the substrate 10 in the edge region 40 of the substrate 10.

The localized nature of the flux of ions 66 may advantageously supply ions selectively to the edge region 40. The ions generated by the localized plasma 36 may increase the concentration of ions above the edge region 40 which increases the total flux of ions in the edge region 40 because more ions are available to be accelerated. By applying edge control power to the conductive structure 730 the flux of ions to the edge region 40 can be controlled.

Figure 8:
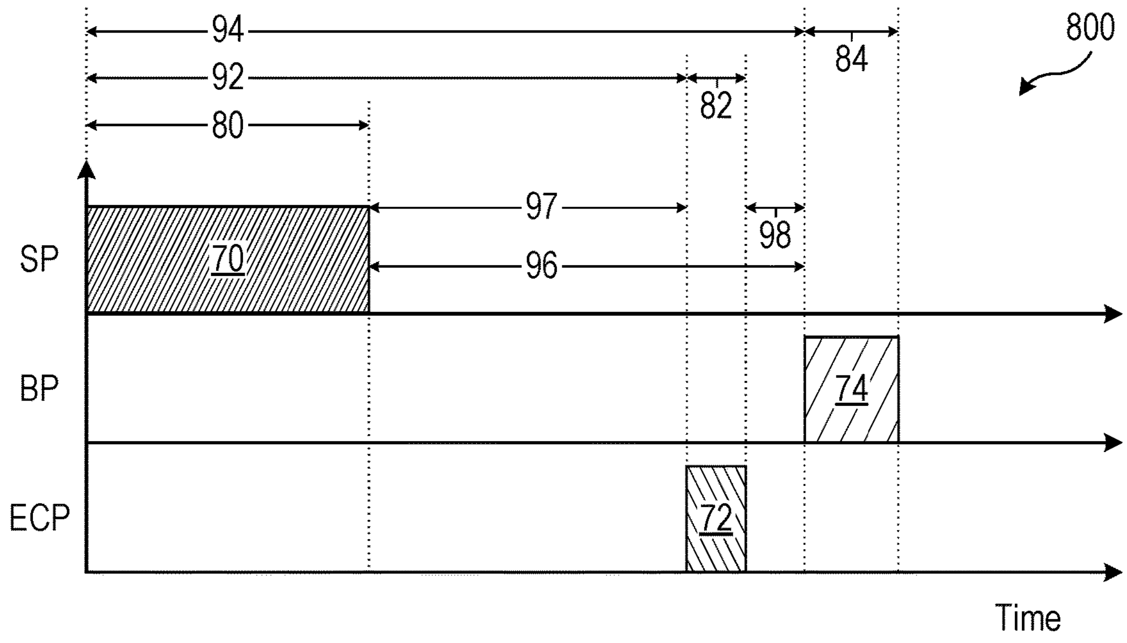
FIG. 8 illustrates a schematic timing diagram of an example plasma processing method including a source power pulse, a bias power pulse, and an edge control power pulse in accordance with embodiments of the invention.

FIG. 8 illustrates a schematic timing diagram of an example plasma processing method including a source power pulse, a bias power pulse, and an edge control power pulse in accordance with embodiments of the invention. The method of FIG. 8 may be combined with other methods and performed using the systems and apparatuses as described herein. For example, the method of FIG. 8 may be combined with any of the embodiments of FIGS. 1-7, 9, and 10. Similarly labeled elements may be as previously described.

Referring to FIG. 8, a schematic timing diagram of a method 800 of plasma processing shows the application of source power (SP), bias power (BP), and edge control power (ECP) in a plasma processing apparatus. For example, a primary plasma may be generated using the source power. The flux of species to the edge region of a substrate may be controlled by applying edge control power to a conductive structure (e.g. a resonant structure) to generate a localized plasma at the edge region.

Any combination of the source power, bias power, and edge control power may be applied to the plasma processing apparatus as a pulse. For example, as shown, an SP pulse 70 having an SP pulse width 80 may be applied to generate a primary plasma. An ECP pulse 72 having an ECP pulse width 82 may be applied to control process conditions in the edge region. The ECP pulse width 82 may be any suitable duration, but is less than the duration of the SP pulse width 80 in one embodiment.

Additionally, the ECP pulse 72 may be applied with an ECP pulse delay 92 that represents the difference in the timing of the leading edge of the ECP pulse 72 compared to the leading edge SP pulse 70. The ECP pulse delay 92 may be any suitable duration including zero. For some values of the ECP pulse delay 92 that exceed the SP pulse width 80, an SP-ECP delay 97 may be generated between the trailing edge of the SP pulse 70 and the leading edge of the ECP pulse 72.

A BP pulse 74 having a BP pulse width 84 may also be applied (e.g. to direct ions toward the substrate). The BP pulse width 84 may be any suitable duration, but is less than the duration of the SP pulse width 80 in one embodiment. In one embodiment, the BP pulse width 84 is greater than the ECP pulse width 82.

Additionally, the BP pulse 74 may be applied with an BP pulse delay 94 that represents the difference in the timing of the leading edge of the BP pulse 74 compared to the leading edge of the SP pulse 70. The BP pulse delay 94 may be any suitable duration including zero. For some values of the BP pulse delay 94 that exceed the SP pulse width 80, an SP-BP delay 96 may be generated between the trailing edge of the SP pulse 70 and the leading edge of the BP pulse 74. Similarly, appropriate values of the ECP pulse delay 92, the ECP pulse width 82, and the BP pulse delay 94 will result in an ECP-BP delay 98. Delays between pulses may be used to allow the plasma to cool or to allow by products to be removed, among other uses.

Figure 9:
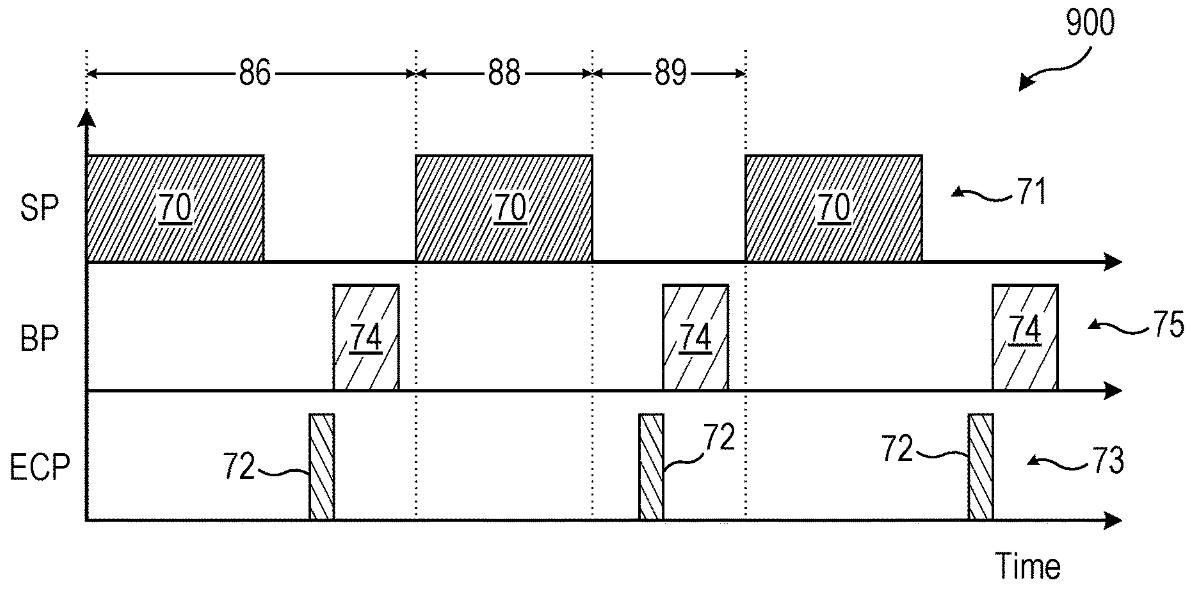
FIG. 9 illustrates a schematic timing diagram of an example plasma processing method including series of pulses in accordance with embodiments of the invention.

FIG. 9 illustrates a schematic timing diagram of an example plasma processing method including series of pulses in accordance with embodiments of the invention. The method of FIG. 9 may be combined with other methods and performed using the systems and apparatuses as described herein. For example, the method of FIG. 9 may be combined with any of the embodiments of FIGS. 1-8 and 10. Similarly labeled elements may be as previously described.

Referring to FIG. 9, a schematic timing diagram of a method 900 of plasma processing shows the application of source power (SP), bias power (BP), and edge control power (ECP) in a plasma processing apparatus. The method 900 is a specific implementation of the method 800 of FIG. 8 where pulses are cyclically applied to the plasma processing apparatus. For example, as shown, a series of SP pulses 71, a series of ECP pulses 73, and a series of BP pulses 75 are cyclically applied during the method 900.

A cycle 86 includes the duration between the leading edges of successive SP pulses 70 of the series of SP pulses 71. For example, the cycle 86 is the period of the cyclically applied pulses. The duration of a cycle 86 may be constant or may be varied during the plasma processing method. During the SP pulses 70, the generated plasma (e.g. a primary plasma) may be in a glow phase 88. In between the SP pulses 70, no source power is being applied and the generated plasma may be in an afterglow phase 89.

One or more ECP pulses 72 may be applied during each cycle 86. Similarly, one or more BP pulses 74 may also be applied each cycle 86. In various embodiments, the ECP pulse 72 and the BP pulses 74 may be applied in the afterglow phase 89 of a generated plasma. In one embodiment, an ECP pulse 72 is applied during the afterglow phase 89 after a nonzero delay between the ECP pulse 72 and the preceding SP pulse 70. In some embodiments, one or more BP pulses 74 are applied in the afterglow phase 89 immediately following an ECP pulse 72. In one embodiment, a single BP pulse 74 is applied during each cycle 86 in the afterglow phase 89 immediately following an ECP pulse 72. However, as discussed above, the ECP pulses 72 and the BP pulses 74 may have any desired combination of delay and pulse width. The specific timing of the plasma processing method will depend on the specific details of a given application.

The flux to the edge region of a substrate may advantageously be controlled by coupling AC power to a conductive structure (e.g. a resonant structure) using the series of ECP pulses 73 to generate a secondary plasma. Each of the series of ECP pulses 73 may be applied to the conductive structure during the glow phase 88 of the primary plasma. Additionally or alternatively, each of the series of ECP pulses 73 may be applied to the conductive structure during the afterglow phase 89 of the primary plasma.

For implementations that utilize bias power, the series of BP pulses 75 may be applied to a pedestal supporting the substrate during the afterglow phase 89 of the primary plasma. For example, each of the series of BP pulses 75 may be coupled to the pedestal after a respective ECP pulse 72 of the series of ECP pulses 73.

Figure 10:
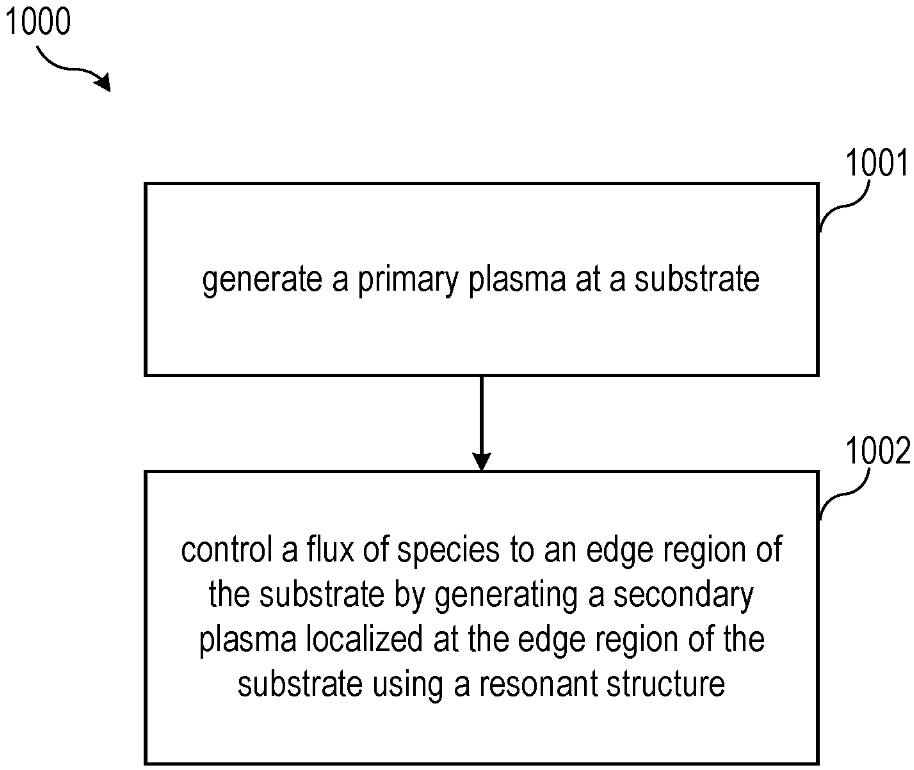
FIG. 10 illustrates an example plasma processing method in accordance with an embodiment of the invention.

FIG. 10 illustrates an example plasma processing method in accordance with an embodiment of the invention. The method of FIG. 10 may be combined with other methods and performed using the systems and apparatuses as described herein. For example, the method of FIG. 10 may be combined with any of the embodiments of FIGS. 1-9. Although shown in a logical order, the arrangement and numbering of the steps of FIG. 10 are not intended to be limited. The method steps of FIG. 10 may be performed in any suitable order or concurrently with one another as may be apparent to a person of skill in the art.

Referring to FIG. 10, step 1001 of a method 1000 of plasma processing includes generating a primary plasma at a substrate. Step 1002 is to control a flux of species to an edge region of the substrate by generating a secondary plasma localized at the edge region of the substrate using a resonant structure. Controlling the flux of species to the edge region may optionally include controlling a flux of radicals to the edge region and/or controlling a flux of ions to the edge region. In some cases step 1001 may be omitted, for example when generating a primary plasma is unnecessary.

Example embodiments of the invention are summarized here. Other embodiments can also be understood from the entirety of the specification as well as the claims filed herein.

Example 1. An apparatus for plasma processing including: a pedestal configured to support a substrate; and a resonant structure disposed at the pedestal, the resonant structure being configured to generate a plasma localized at an edge region of the substrate.

Example 2. The apparatus of example 1, further including: a bias power supply coupled to the pedestal; and an edge control power supply coupled to the resonant structure.

Example 3. The apparatus of example 2, where the edge control power supply is coupled to the resonant structure through the pedestal, the edge control power supply being configured to supply edge control power carried to the resonant structure by the pedestal.

Example 4. The apparatus of example 2, where the bias power supply is a high frequency (HF) power supply, and where the edge control power supply is a very high frequency (VHF) power supply or an ultra high frequency (UHF) power supply.

Example 5. The apparatus of example 4, where the first frequency is less than 30 MHz and the second frequency is greater than or equal to 30 MHz.

Example 6. The apparatus of one of examples 1 to 5, further including: a focus ring disposed on the pedestal and configured to surround the substrate, where the resonant structure is embedded in the focus ring.

Example 7. The apparatus of one of examples 1 to 6, where the resonant structure includes an inductive structure overlying a capacitive structure.

Example 8. A focus ring including: an insulating material having an annular shape that defines an interior opening; and a conductive structure embedded within the insulating material, the conductive structure being configured to generate a plasma localized along the annular shape and surrounding the interior opening.

Example 9. The focus ring of example 8, where the conductive structure includes an inductive structure overlying a capacitive structure.

Example 10. The focus ring of example 9, where the capacitive structure includes a top plate and a bottom plate arranged in a parallel plate capacitor configuration, and where the inductive structure includes a series of spiral segments, each of the spiral segments including a first end connected to the bottom plate, and a second end connected to the top plate.

Example 11. The focus ring of one of examples 8 to 10, wherein the conductive structure comprises a rotational symmetry of an order greater than one.

Example 12. The focus ring of one of examples 8 to 11, further including: a top cover disposed over the insulating material, the top cover including a different material than the insulating material.

Example 13. The focus ring of example 12, where the insulating material is a first ceramic material, and where the different material of the top cover is a second ceramic material co-fired along with the first ceramic material to form the top cover.

Example 14. The focus ring of example 12, where the top cover is a thermal spray coating.

Example 15. A method of plasma processing including: generating a primary plasma at a substrate; and controlling a flux of species to an edge region of the substrate by generating a secondary plasma localized at the edge region of the substrate using a resonant structure.

Example 16. The method of example 15, where controlling the flux of species to the edge region includes controlling a flux of radicals to the edge region.

Example 17. The method of one of examples 15 and 16, where controlling the flux of species to the edge region includes controlling a flux of ions to the edge region.

Example 18. The method of one of examples 15 to 17, where: the primary plasma is generated using a series of source power pulses, the primary plasma being in a glow phase during each of the series of source power pulses and in an afterglow phase in between each of the series of source power pulses; and controlling the flux to the edge region includes coupling alternating current (AC) power to the resonant structure as a series of edge control power pulses to generate the secondary plasma.

Example 19. The method of example 18, where each of the series of edge control power pulses is applied to the resonant structure during the glow phase of the primary plasma.

Example 20. The method of one of examples 18 and 19, where each of the series of edge control power pulses is applied to the resonant structure during the afterglow phase of the primary plasma.

Example 21. The method of one of examples 18 to 20, further including: coupling a series of bias power pulses to a pedestal supporting the substrate that are applied during the afterglow phase of the primary plasma, each of the series of bias power pulses being applied to the pedestal after a respective edge control power pulse of the series of edge control power pulses.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for plasma processing comprising:
a pedestal configured to support a substrate comprising a major surface, a vertical direction of the apparatus being normal to the major surface;
a focus ring disposed on the pedestal and configured to surround the substrate; and
a resonant structure fully encased within the focus ring, the resonant structure surrounding the substrate and being configured to generate a plasma localized at an edge region of the substrate, wherein the resonant structure comprises a conductive structure comprising an inductive structure electrically connected to, disposed over, and vertically aligned with a capacitive structure.

2. The apparatus of claim 1, further comprising:
a bias power supply coupled to the pedestal; and
an edge control power supply coupled to the resonant structure.

3. The apparatus of claim 2, wherein the bias power supply is a high frequency (HF) power supply, and wherein the edge control power supply is a very high frequency (VHF) power supply or an ultra high frequency (UHF) power supply.

4. The apparatus of claim 2, wherein the edge control power supply is an alternating current (AC) power supply configured to supply AC power at a frequency in a range of about 30 MHz to about 3 GHz.

5. The apparatus of claim 1, wherein the conductive structure comprises a finite rotational symmetry of an order greater than one.

6. The apparatus of claim 1, further comprising:
an edge control power supply coupled to the pedestal and configured to indirectly coupled alternating current (AC) power to the conductive structure
wherein the focus ring comprises an insulating material having an annular shape that defines an interior opening the AC power being indirectly coupled to the conductive structure through the insulating material.

7. The apparatus of claim 6, further comprising:
a bias power supply configured to couple bias power to the substrate through a feed line, the AC power of the edge control power supply also being connected to the feed line along with the bias power.

8. The apparatus of claim 6, further comprising:
a top cover disposed over the insulating material, the top cover comprising a different material than the insulating material.

9. The apparatus of claim 8, wherein the insulating material is a first ceramic material, and wherein the different material of the top cover is a second ceramic material co-fired along with the first ceramic material to form the top cover.

10. The apparatus of claim 8, wherein the top cover is a thermal spray coating.

11. The apparatus of claim 1, wherein the inductive structure comprises a plurality of inductive substructures, and the capacitive structure is a single parallel plate capacitor comprising a top plate and a bottom plate, each of the plurality of inductive substructures being disposed over the single parallel plate capacitor and comprising two ends electrically connected to the top plate and the bottom plate, respectively.

12. The apparatus of claim 11, wherein the plurality of inductive substructures is a series of spiral segments, each of the spiral segments extending in a direction comprising both a radial component and an azimuthal component.

13. An apparatus for plasma processing comprising:

a pedestal configured to support a substrate comprising a major surface, a vertical direction of the apparatus being normal to the major surface;

a resonant structure with a resonant frequency greater than 30 MHz disposed at, on, or in the pedestal, the resonant structure surrounding the substrate and comprising a conductive structure comprising an inductive structure electrically connected to, disposed over, and vertically aligned with a capacitive structure that comprises a top plate and a bottom plate in a parallel plate capacitor configuration; and an edge control power supply coupled to the pedestal, the edge control power supply being configured to indirectly couple alternating current (AC) power to the resonant structure substantially at the resonant frequency through an insulating material separating the capacitive structure from the pedestal to generate a plasma localized at an edge region of the substrate.

14. The apparatus of claim 13, wherein the resonant frequency is between about 100 MHz and about 500 MHz.

15. The apparatus of claim 13, further comprising:

a bias power supply coupled to the pedestal, the bias power supply being a high frequency power (HF) supply configured to supply bias power at a frequency less than or equal to 30 MHz.

16. The apparatus of claim 13, wherein the resonant frequency is about 100 MHz.

17. An apparatus for plasma processing comprising:

a pedestal configured to support a substrate;

a conductive structure comprising a capacitive structure and an inductive structure, both fully encased within a focus ring disposed on the pedestal and comprising an annular shape surrounding the substrate, the capacitive structure and the inductive structure together forming a resonant inductor-capacitor (LC) circuit;

an edge control power supply coupled to the pedestal, the edge control power supply being configured to couple alternating current (AC) power to the conductive structure to generate a plasma localized along the annular shape surrounding the substrate; and a bias power supply configured to couple bias power to the substrate through a feed line, the AC power of the edge control power supply also being connected to the feed line along with the bias power.

18. The apparatus of claim 17, wherein the bias power supply is a high frequency power (HF) supply configured to supply bias power at a frequency less than or equal to 30 MHz, the edge control power supply being further configured to supply the AC power at a frequency greater than 30 MHz.

19. The apparatus of claim 17, wherein the capacitive structure and the inductive structure are both embedded in an insulating material of the focus ring, and the edge control power supply is configured to indirectly couple coupled the AC power to the conductive structure through the insulating material of the focus ring.

20. The apparatus of claim 17, wherein the resonant LC circuit has a resonant frequency greater than about 30 MHz, the edge control power supply being configured to couple the AC power to the resonant LC circuit of the conductive structure substantially at the resonant frequency.

* * * * *